US007434590B2

(12) United States Patent
Sheydayi (10) Patent No.: US 7,434,590 B2
(45) Date of Patent: Oct. 14, 2008

(54) METHOD AND APPARATUS FOR CLAMPING A SUBSTRATE IN A HIGH PRESSURE PROCESSING SYSTEM

(75) Inventor: Alexei Sheydayi, Gilbert, AZ (US)

(73) Assignee: Tokyo Electron Limited, Tokyo (JP)

( * ) Notice: Subject to any disclaimer, the term of this patent is extended or adjusted under 35 U.S.C. 154(b) by 544 days.

(21) Appl. No.: 11/022,248

(22) Filed: Dec. 22, 2004

(65) Prior Publication Data

US 2006/0130875 A1 Jun. 22, 2006

(51) Int. Cl.
*B08B 3/04* (2006.01)
(52) U.S. Cl. .................................. 134/200; 134/902
(58) Field of Classification Search ............... 134/200, 134/902
See application file for complete search history.

(56) References Cited

U.S. PATENT DOCUMENTS

| 2,617,719 | A | 11/1952 | Stewart | 23/312 |
|---|---|---|---|---|
| 2,625,886 | A | 1/1953 | Browne | 103/150 |
| 3,744,660 | A | 7/1973 | Gaines et al. | 220/10 |
| 3,968,885 | A | 7/1976 | Hassan et al. | 214/1 BC |
| 4,029,517 | A | 6/1977 | Rand | 134/11 |
| 4,091,643 | A | 5/1978 | Zucchini | 68/18 C |
| 4,245,154 | A | 1/1981 | Uehara et al. | 250/227 |
| 4,341,592 | A | 7/1982 | Shortes et al. | 156/643 |
| 4,355,937 | A | 10/1982 | Mack et al. | 414/217 |
| 4,367,140 | A | 1/1983 | Wilson | 210/110 |
| 4,406,596 | A | 9/1983 | Budde | 417/393 |
| 4,422,651 | A | 12/1983 | Platts | 277/206 R |
| 4,474,199 | A | 10/1984 | Blaudszun | 134/105 |
| 4,522,788 | A | 6/1985 | Sitek et al. | 422/78 |
| 4,549,467 | A | 10/1985 | Wilden et al. | 91/307 |
| 4,592,306 | A | 6/1986 | Gallego | 118/719 |
| 4,601,181 | A | 7/1986 | Privat | 68/18 C |
| 4,626,509 | A | 12/1986 | Lyman | 435/287 |
| 4,670,126 | A | 6/1987 | Messer et al. | 204/298 |
| 4,682,937 | A | 7/1987 | Credle, Jr. | 417/393 |
| 4,693,777 | A | 9/1987 | Hazano et al. | 156/345 |
| 4,749,440 | A | 6/1988 | Blackwood et al. | 156/646 |
| 4,778,356 | A | 10/1988 | Hicks | 417/397 |

(Continued)

FOREIGN PATENT DOCUMENTS

CH        SE 251213        8/1948

(Continued)

OTHER PUBLICATIONS

WIPO WO 00/05750 Feb. 2000.*

(Continued)

*Primary Examiner*—Frankie L Stinson
(74) *Attorney, Agent, or Firm*—Wood, Herron & Evans, L.L.P.

(57) ABSTRACT

An isolated semiconductor wafer platen is disclosed for use in high pressure processing. The use of vacuum chucking for holding a semiconductor wafer during processing is well known in the art and can be applied to high pressure systems as well, but some difficulties can arise under high pressure processes. Small deflections in even very thick metal support platens can lead to backside wafer wear, platen abrasion, and even breakage of semiconductor wafers. This invention discloses a method to eliminate the transfer of flexure inherent in high pressure vessel walls, yet still retain the vacuum chucking method.

17 Claims, 6 Drawing Sheets

U.S. PATENT DOCUMENTS

| | | | |
|---|---|---|---|
| 4,788,043 A | 11/1988 | Kagiyama et al. | 422/292 |
| 4,789,077 A | 12/1988 | Noe | 220/319 |
| 4,823,976 A | 4/1989 | White, III et al. | 220/211 |
| 4,825,808 A | 5/1989 | Takahashi et al. | 118/719 |
| 4,827,867 A | 5/1989 | Takei et al. | 118/64 |
| 4,838,476 A | 6/1989 | Rahn | 228/180.1 |
| 4,865,061 A | 9/1989 | Fowler et al. | 134/108 |
| 4,879,431 A | 11/1989 | Bertoncini | 435/311 |
| 4,917,556 A | 4/1990 | Stark et al. | 414/217 |
| 4,924,892 A | 5/1990 | Kiba et al. | 134/123 |
| 4,944,837 A | 7/1990 | Nishikawa et al. | 156/646 |
| 4,951,601 A | 8/1990 | Maydan et al. | 118/719 |
| 4,960,140 A | 10/1990 | Ishijima et al. | 134/31 |
| 4,983,223 A | 1/1991 | Gessner | 134/25.4 |
| 5,011,542 A | 4/1991 | Weil | 134/38 |
| 5,013,366 A | 5/1991 | Jackson et al. | 134/1 |
| 5,044,871 A | 9/1991 | Davis et al. | 414/786 |
| 5,062,770 A | 11/1991 | Story et al. | 417/46 |
| 5,068,040 A | 11/1991 | Jackson | 210/748 |
| 5,071,485 A | 12/1991 | Matthews et al. | 134/2 |
| 5,105,556 A | 4/1992 | Kurokawa et al. | 34/12 |
| 5,143,103 A | 9/1992 | Basso et al. | 134/98.1 |
| 5,167,716 A | 12/1992 | Boitnott et al. | 118/719 |
| 5,169,296 A | 12/1992 | Wilden | 417/395 |
| 5,169,408 A | 12/1992 | Biggerstaff et al. | 29/25.01 |
| 5,185,296 A | 2/1993 | Morita et al. | 437/229 |
| 5,186,594 A | 2/1993 | Toshima et al. | 414/217 |
| 5,186,718 A | 2/1993 | Tepman et al. | 29/25.01 |
| 5,188,515 A | 2/1993 | Horn | 417/63 |
| 5,190,373 A | 3/1993 | Dickson et al. | 366/146 |
| 5,191,993 A | 3/1993 | Wanger et al. | 220/333 |
| 5,193,560 A | 3/1993 | Tanaka et al. | 134/56 R |
| 5,195,878 A | 3/1993 | Sahiavo et al. | 417/393 |
| 5,213,485 A | 5/1993 | Wilden | 417/393 |
| 5,213,619 A | 5/1993 | Jackson et al. | 134/1 |
| 5,215,592 A | 6/1993 | Jackson | 134/1 |
| 5,217,043 A | 6/1993 | Novakovi | 137/460 |
| 5,221,019 A | 6/1993 | Pechacek et al. | 220/315 |
| 5,222,876 A | 6/1993 | Budde | 417/393 |
| 5,224,504 A | 7/1993 | Thompson et al. | 134/155 |
| 5,236,602 A | 8/1993 | Jackson | 210/748 |
| 5,236,669 A | 8/1993 | Simmons et al. | 422/113 |
| 5,237,824 A | 8/1993 | Pawliszyn | 62/51.1 |
| 5,240,390 A | 8/1993 | Kvinge et al. | 417/393 |
| 5,243,821 A | 9/1993 | Schuck et al. | 62/50.6 |
| 5,246,500 A | 9/1993 | Samata et al. | 118/719 |
| 5,251,776 A | 10/1993 | Morgan, Jr. et al. | 220/360 |
| 5,267,455 A | 12/1993 | Dewees et al. | 68/5 C |
| 5,280,693 A | 1/1994 | Heudecker | 53/306 |
| 5,285,352 A | 2/1994 | Pastore et al. | 361/707 |
| 5,288,333 A | 2/1994 | Tanaka et al. | 134/31 |
| 5,304,515 A | 4/1994 | Morita et al. | 437/231 |
| 5,306,350 A | 4/1994 | Hoy et al. | 134/22.14 |
| 5,313,965 A | 5/1994 | Palen | 134/61 |
| 5,314,574 A | 5/1994 | Takahashi | 156/646 |
| 5,316,591 A | 5/1994 | Chao et al. | 134/34 |
| 5,328,722 A | 7/1994 | Ghanayem et al. | 427/250 |
| 5,337,446 A | 8/1994 | Smith et al. | 15/21.1 |
| 5,339,844 A | 8/1994 | Stanford, Jr. et al. | 134/107 |
| 5,355,901 A | 10/1994 | Mielnik et al. | 134/105 |
| 5,368,171 A | 11/1994 | Jackson | 134/147 |
| 5,370,740 A | 12/1994 | Chao et al. | 134/1 |
| 5,370,741 A | 12/1994 | Bergman | 134/3 |
| 5,377,705 A | 1/1995 | Smith, Jr. et al. | 134/95.3 |
| 5,401,322 A | 3/1995 | Marshall | 134/13 |
| 5,403,621 A | 4/1995 | Jackson et al. | 427/255.1 |
| 5,404,894 A | 4/1995 | Shiraiwa | 134/66 |
| 5,412,958 A | 5/1995 | Iliff et al. | 68/5 C |
| 5,417,768 A | 5/1995 | Smith, Jr. et al. | 134/10 |
| 5,433,334 A | 7/1995 | Reneau | 220/319 |
| 5,447,294 A | 9/1995 | Sakata et al. | 266/257 |
| 5,456,759 A | 10/1995 | Stanford, Jr. et al. | 134/1 |
| 5,494,526 A | 2/1996 | Paranjpe | 134/1 |
| 5,500,081 A | 3/1996 | Bergman | 156/646.1 |
| 5,501,761 A | 3/1996 | Evans et al. | 156/344 |
| 5,503,176 A | 4/1996 | Dummire et al. | 137/15 |
| 5,505,219 A | 4/1996 | Lansberry et al. | 134/105 |
| 5,509,431 A | 4/1996 | Smith, Jr. et al. | 134/95.1 |
| 5,522,938 A | 6/1996 | O'Brien | 134/1 |
| 5,526,834 A | 6/1996 | Mielnik et al. | 134/105 |
| 5,533,538 A | 7/1996 | Marshall | 134/104.4 |
| 5,571,330 A | 11/1996 | Kyogoku | 118/719 |
| 5,589,224 A | 12/1996 | Tepman et al. | 427/248.1 |
| 5,621,982 A | 4/1997 | Yamashita et al. | 34/203 |
| 5,629,918 A | 5/1997 | Ho et al. | 369/112 |
| 5,644,855 A | 7/1997 | McDermott et al. | 34/516 |
| 5,649,809 A | 7/1997 | Stapelfeldt | 417/63 |
| 5,656,097 A | 8/1997 | Olesen et al. | 134/1 |
| 5,669,251 A | 9/1997 | Townsend et al. | 68/58 |
| 5,672,204 A | 9/1997 | Habuka | 117/204 |
| 5,683,977 A | 11/1997 | Jureller et al. | 510/286 |
| 5,702,228 A | 12/1997 | Tamai et al. | 414/744.5 |
| 5,706,319 A | 1/1998 | Holtz | 376/203 |
| 5,746,008 A | 5/1998 | Yamashita et al. | 34/211 |
| 5,769,588 A | 6/1998 | Toshima et al. | 414/217 |
| 5,797,719 A | 8/1998 | James et al. | 417/46 |
| 5,798,126 A | 8/1998 | Fujikawa et al. | 425/78 |
| 5,817,178 A | 10/1998 | Mita et al. | 118/666 |
| 5,868,856 A | 2/1999 | Douglas et al. | 134/2 |
| 5,868,862 A | 2/1999 | Douglas et al. | 134/26 |
| 5,881,577 A | 3/1999 | Sauer et al. | 68/5 |
| 5,882,165 A | 3/1999 | Maydan et al. | 414/217 |
| 5,888,050 A | 3/1999 | Fitzgerald et al. | 417/46 |
| 5,898,727 A | 4/1999 | Fujikawa et al. | 373/110 |
| 5,900,107 A | 5/1999 | Murphy et al. | 156/359 |
| 5,900,354 A | 5/1999 | Batchelder | 430/395 |
| 5,904,737 A | 5/1999 | Preston et al. | 8/158 |
| 5,906,866 A | 5/1999 | Webb | 427/534 |
| 5,908,510 A | 6/1999 | McCullough et al. | 134/2 |
| 5,928,389 A | 7/1999 | Jevtic | 29/25.01 |
| 5,932,100 A | 8/1999 | Yager et al. | 210/634 |
| 5,934,856 A | 8/1999 | Asakawa et al. | 414/217 |
| 5,934,991 A | 8/1999 | Rush | 454/187 |
| 5,955,140 A | 9/1999 | Smith et al. | 427/96 |
| 5,975,492 A | 11/1999 | Brenes | 251/175 |
| 5,976,264 A | 11/1999 | McCullough et al. | 134/2 |
| 5,979,306 A | 11/1999 | Fujikawa et al. | 100/90 |
| 5,980,648 A | 11/1999 | Adler | 134/34 |
| 5,981,399 A | 11/1999 | Kawamura et al. | 438/715 |
| 5,989,342 A | 11/1999 | Ikeda et al. | 118/52 |
| 6,005,226 A | 12/1999 | Aschner et al. | 219/390 |
| 6,017,820 A | 1/2000 | Ting et al. | 438/689 |
| 6,024,801 A | 2/2000 | Wallace et al. | 134/1 |
| 6,029,371 A | 2/2000 | Kamikawa et al. | 34/516 |
| 6,035,871 A | 3/2000 | Eui-Yeol | 134/61 |
| 6,037,277 A | 3/2000 | Masakara et al. | 438/787 |
| 6,053,348 A | 4/2000 | Morch | 220/263 |
| 6,056,008 A | 5/2000 | Adams et al. | 137/487.5 |
| 6,067,728 A | 5/2000 | Farmer et al. | 34/470 |
| 6,077,053 A | 6/2000 | Fujikawa et al. | 417/399 |
| 6,077,321 A | 6/2000 | Adachi et al. | 29/25.01 |
| 6,082,150 A | 7/2000 | Stucker | 68/18 R |
| 6,085,935 A | 7/2000 | Malchow et al. | 220/813 |
| 6,097,015 A | 8/2000 | McCullough et al. | 219/686 |
| 6,110,232 A | 8/2000 | Chen et al. | 29/25.01 |
| 6,122,566 A | 9/2000 | Nguyen et al. | 700/218 |
| 6,128,830 A | 10/2000 | Bettcher et al. | 34/404 |
| 6,145,519 A | 11/2000 | Konishi et al. | 134/95.2 |
| 6,149,828 A | 11/2000 | Vaartstra | 216/57 |
| 6,159,295 A | 12/2000 | Maskara et al. | 118/688 |
| 6,164,297 A | 12/2000 | Kamikawa | 134/61 |
| 6,186,722 B1 | 2/2001 | Shirai | 414/217 |
| 6,203,582 B1 | 3/2001 | Berner et al. | 29/25.01 |
| 6,216,364 B1 | 4/2001 | Tanaka et al. | 34/448 |

| | | | |
|---|---|---|---|
| 6,228,563 B1 | 5/2001 | Starov et al. ................ 430/327 |
| 6,235,634 B1 | 5/2001 | White et al. ................ 438/680 |
| 6,239,038 B1 | 5/2001 | Wen .......................... 438/745 |
| 6,241,825 B1 | 6/2001 | Wytman ..................... 118/733 |
| 6,242,165 B1 | 6/2001 | Vaartstra .................... 430/329 |
| 6,244,121 B1 | 6/2001 | Hunter ...................... 73/865.9 |
| 6,251,250 B1 | 6/2001 | Keigler ........................ 205/89 |
| 6,277,753 B1 | 8/2001 | Mullee et al. ............... 438/692 |
| 6,286,231 B1 | 9/2001 | Bergman et al. ............. 34/410 |
| 6,305,677 B1 | 10/2001 | Lenz .......................... 269/13 |
| 6,306,564 B1 | 10/2001 | Mullee |
| 6,319,858 B1 | 11/2001 | Lee et al. .................... 438/787 |
| 6,334,266 B1 | 1/2002 | Moritz et al. ................ 34/337 |
| 6,344,174 B1 | 2/2002 | Miller et al. ................. 422/98 |
| 6,355,072 B1 | 3/2002 | Racette et al. ................ 8/142 |
| 6,388,317 B1 | 5/2002 | Reese ........................ 257/713 |
| 6,389,677 B1 | 5/2002 | Lenz .......................... 29/559 |
| 6,418,956 B1 | 7/2002 | Bloom ........................ 137/14 |
| 6,436,824 B1 | 8/2002 | Chooi et al. ................ 438/687 |
| 6,454,519 B1 | 9/2002 | Toshima et al. ............. 414/805 |
| 6,454,945 B1 | 9/2002 | Weigl et al. ................. 210/634 |
| 6,464,790 B1 | 10/2002 | Sherstinsky et al. ......... 118/715 |
| 6,497,239 B2 * | 12/2002 | Farmer et al. ............. 134/56 R |
| 6,508,259 B1 | 1/2003 | Tseronis et al. ............. 134/105 |
| 6,509,141 B2 | 1/2003 | Mullee |
| 6,521,466 B1 | 2/2003 | Castrucci ....................... 438/5 |
| 6,541,278 B2 | 4/2003 | Morita et al. ................... 438/3 |
| 6,546,946 B2 | 4/2003 | Dunmire .................. 137/15.18 |
| 6,550,484 B1 | 4/2003 | Gopinath et al. ............. 134/1.2 |
| 6,558,475 B1 | 5/2003 | Jur et al. ...................... 134/21 |
| 6,561,213 B2 | 5/2003 | Wang et al. ................. 137/263 |
| 6,561,220 B2 | 5/2003 | McCullough et al. ... 137/565.12 |
| 6,561,481 B1 | 5/2003 | Filonczuk .............. 251/129.12 |
| 6,561,767 B2 | 5/2003 | Berger et al. ................. 417/53 |
| 6,564,826 B2 | 5/2003 | Shen ...................... 137/505.18 |
| 6,722,642 B1 * | 4/2004 | Sutton et al. .................. 269/21 |
| 6,802,961 B2 | 10/2004 | Jackson ...................... 210/86 |
| 6,848,458 B1 * | 2/2005 | Shrinivasan et al. ......... 134/108 |
| 6,890,853 B2 | 5/2005 | Biberger et al. ............. 438/670 |
| 7,021,635 B2 * | 4/2006 | Sheydayi ....................... 279/3 |
| 2003/0198895 A1 | 10/2003 | Toma et al. |
| 2004/0020518 A1 | 2/2004 | DeYoung et al. .............. 134/30 |
| 2004/0112409 A1 | 6/2004 | Schilling |
| 2004/0177867 A1 | 9/2004 | Schilling |
| 2004/0187894 A1 * | 9/2004 | Parks .......................... 134/21 |
| 2005/0077597 A1 | 4/2005 | Toma et al. |

FOREIGN PATENT DOCUMENTS

| | | |
|---|---|---|
| DE | 36 08 783 A1 | 9/1987 |
| DE | 39 04 514 C2 | 3/1990 |
| DE | 40 04 111 C2 | 8/1990 |
| DE | 39 06 724 C2 | 9/1990 |
| DE | 39 06 735 C2 | 9/1990 |
| DE | 39 06 737 A1 | 9/1990 |
| DE | 44 29 470 A1 | 3/1995 |
| DE | 43 44 021 A1 | 6/1995 |
| DE | 198 60 084 A1 | 7/2000 |
| EP | 0 244 951 A2 | 11/1987 |
| EP | 02 72 141 A2 | 6/1988 |
| EP | 0 283 740 A2 | 9/1988 |
| EP | 0 302 345 A2 | 2/1989 |
| EP | 0 370 233 A1 | 5/1990 |
| EP | 0 391 035 A2 | 10/1990 |
| EP | 0 453 867 A1 | 10/1991 |
| EP | 0 518 653 B1 | 12/1992 |
| EP | 0 536 752 A2 | 4/1993 |
| EP | 0 572 913 A1 | 12/1993 |
| EP | 0 587 168 A1 | 3/1994 |
| EP | 0 620 270 A3 | 10/1994 |
| EP | 0 679 753 B1 | 11/1995 |
| EP | 0 711 864 B1 | 5/1996 |
| EP | 0 726 099 A2 | 8/1996 |
| EP | 0 727 711 A2 | 8/1996 |
| EP | 0 822 583 A2 | 2/1998 |
| EP | 0 829 312 A2 | 3/1998 |
| EP | 0 836 895 A2 | 4/1998 |
| EP | 0 903 775 A2 | 3/1999 |
| FR | 1 499 491 | 9/1967 |
| GB | 2 003 975 | 3/1979 |
| GB | 2 193 482 | 2/1988 |
| JP | 60-192333 | 9/1985 |
| JP | 60-2348479 | 11/1985 |
| JP | 60-246635 | 12/1985 |
| JP | 61-017151 | 1/1986 |
| JP | 61-231166 | 10/1986 |
| JP | 62-125619 | 6/1987 |
| JP | 63-303059 | 12/1988 |
| JP | 1-045131 | 2/1989 |
| JP | 1-246835 | 10/1989 |
| JP | 2-148841 | 6/1990 |
| JP | 2-209729 | 8/1990 |
| JP | 2-304941 | 12/1990 |
| JP | 7-142333 | 6/1995 |
| JP | 8-186140 A | 7/1996 |
| JP | 8-222508 A | 8/1996 |
| JP | 10-144757 A | 5/1998 |
| JP | 56-142629 | 11/1998 |
| JP | 10335408 A | 12/1998 |
| JP | 11-200035 | 7/1999 |
| JP | 2000-106358 | 4/2000 |
| WO | WO 87/07309 | 12/1987 |
| WO | WO 90/06189 | 6/1990 |
| WO | WO 90/13675 | 11/1990 |
| WO | WO 91/12629 A | 8/1991 |
| WO | WO 93/14255 | 7/1993 |
| WO | WO 93/14259 | 7/1993 |
| WO | WO 93/20116 | 10/1993 |
| WO | WO 96/277704 | 9/1996 |
| WO | WO 99/18603 A | 4/1999 |
| WO | WO 99/49998 | 10/1999 |
| WO | WO 00/36635 | 6/2000 |
| WO | WO 00/73241 A1 | 12/2000 |
| WO | WO 01/10733 A1 | 2/2001 |
| WO | WO 01/33615 A3 | 5/2001 |
| WO | WO 01/55628 A1 | 8/2001 |
| WO | WO 01/68279 A2 | 9/2001 |
| WO | WO 01/74538 A1 | 10/2001 |
| WO | WO 01/78911 A1 | 10/2001 |
| WO | WO 01/85391 A2 | 11/2001 |
| WO | WO 01/94782 A2 | 12/2001 |
| WO | WO 02/09894 A2 | 2/2002 |
| WO | WO 02/11191 A2 | 2/2002 |
| WO | WO 02/16051 A2 | 2/2002 |
| WO | WO 03/030219 A2 | 10/2003 |

OTHER PUBLICATIONS

J. B. Rubin et al., *A Comparison of Chilled DI Water/Ozone and $CO_2$-based Supercritical Fluids as Replacements for Photoresist-Stripping Solvents*, IEEE/CPMT Int'l Electronics Manufacturing Technology Symposium, pp. 308-314, 1998.

*Los Alamos National Laboratory*, Solid State Technology, pp. S10 & S14, Oct. 1998.

*Supercritical Carbon Dioxide Resist Remover, SCORR, the Path to Least Photoresistance*Los Alamos National Laboratory, 1998.

Z. Guan et al., *Fluorocarbon-Based Heterophase Polymeric Materials. I. Block Copolymer Surfactants for Carbon Dioxide Applications*, Macromolecules, vol. 27, pp. 5527-5532, 1994.

*International Journal of Environmentally Conscious Design & Manufacturing*, vol. 2, No. 1, pp. 83, 1993.

Matson and Smith , *Supercritical Fluids*, Journal of the American Ceramic Society, vol. 72, No. 6, pp. 872-874.

D. H. Ziger et al., *Compressed Fluid Technology: Application to RIE Developed Resists*, AlChE Journal, vol. 33, No. 10, pp. 1585-1591, Oct. 1987.

Kirk-Other, *Alcohol Fuels to Toxicology*, Encyclopedia of Chemical Terminology, 3rd ed., Supplement Volume, New York: John Wiley & Sons, pp. 872-893, 1984.

*Cleaning with Supercritical $Co_2$*, NASA Tech Briefs, MFS-29611, Marshall Space Flight Center, Alabama, Mar. 1979.

N. Basta, *Supercritical Fluids: Still Seeking Acceptance*, Chemical Engineering vol. 92, No. 3, pp. 14, Feb. 24, 1985.

D. Takahashi, *Los Alamos Lab Finds Way to Cut Chip Toxic Waste*, Wall Street Journal, Jun. 22, 1998.

*Supercritical $CO_2$ Process Offers Less Mess from Semiconductor Plants*, Chemical Engineering Magazine, pp. 27 & 29, Jul. 1988.

Y. P. Sun, *Preparation of Polymer Protected Semiconductor Nanoparticles Through the Rapid Expansion of Supercritical Fluid Solution*, Chemical Physics Letters, pp. 585-588, May 22, 1998.

K. Jackson et al., *Surfactants and Micromulsions in Supercritical Fluids*, Supercritical Fluid Cleaning, Noyes Publications, Westwood, NJ, pp. 87-120, Spring 1998.

M. Kryszcwski, *Production of Metal and Semiconductor Nanoparticles in Polymer Systems*, Polimery, pp. 65-73, Feb. 1998.

G. L. Bakker et al., *Surface Cleaning and Carbonaceous Film Removal Using High Pressure, High Temperature Water, and Water/ $CO_2$ Mixtures*, J Electrochem Soc., vol. 145, No. 1, pp. 284-291, Jan. 1998.

C. K. Ober et al., *Imaging Polymers with Supercritical Carbon Dioxide*, Advanced Materials, vol. 9, No. 13, pp. 1039-1043, Nov. 3, 1997.

E. M. Russick et al., *Supercritical Carbon Dioxide Extraction of Solvent from Micro-Machined Structures*, Supercritical Fluids Extraction and Pollution Prevention, ACS Symposium Series, vol. 670, pp. 255-269, Oct. 21, 1997.

N. Dahmen et al., *Supercritical Fluid Extraction of Grinding and Metal Cutting Waste Contaminated with Oils*, Supercritical Fluids—Extraction and Pollution Prevention, ACS Symposium Series, vol. 670, pp. 270-279, Oct. 21, 1997.

C. M. Wai, *Supercritical Fluid Extraction: Metals as Complexes*, Journal of Chromatography A, vol. 785, pp. 369-383, Oct. 17, 1997.

C. Xu et al., *Submicron-Sized Spherical Yttrium Oxide Based Phosphors Prepared by Supercritical $Co_2$-Assisted Nerosolization and Pyrolysis*, Appl. Phys. Lett., vol. 71, No. 22, pp. 1643-1645, Sep. 22, 1997.

Y. Tomioka et al., *Decomposition of Tetramethylammonium (TMA) in a Positive Photo-resist Developer by Supercritical Water*, Abstracts of Papers 214th ACS Natl Meeting, American Chemical Society, Abstract No. 108, Sep. 7, 1997.

H. Klein et al., *Cyclic Organic Carbonates Serve as Solvents and Reactive Diluents*, Coatings World, pp. 38-40, May 1997.

J. Bühler et al., *Linear Array of Complementary Metal Oxide Semiconductor Double-Pass Metal Micro-mirrors*, Opt. Eng. vol. 36, No. 5, pp. 1391-1398, May 1997.

M. H. Jo et al., *Evaluation of $SiO_2$ Aerogel Thin Film with Ultra Low Dielectric Constant as an Intermetal Dielectric*, Microelectronic Engineering, vol. 33, pp. 343-348, Jan. 1997.

J. B. McClain et al., *Design of Nonionic Surfactants for Supercritical Carbon Dioxide*, Science, vol. 274, pp. 2049-2052, Dec. 20, 1996.

L. Znaidi et al., *Batch and Semi-Continuous Synthesis of Magnesium Oxide Powders from Hydrolysis and Supercritical Treatment of $Mg(OCH_2)_3$*, Materials Research Bulletin, vol. 31, No. 12, pp. 1527-1535, Dec. 1996.

M. E. Tadros, *Synthesis of Titanium Dioxide Particles in Supercritical $Co_2$*, J. Supercritical Fluids, vol. 9, pp. 172-176, Sep. 1996.

V. G. Courtecuisse et al., *Kinetics of the Titanium Isopropoxide Decomposition in Supercritical Isopropyl Alcohol*, Ind. Eng. Chem. Res., vol. 35, No. 8, pp. 2539-2545, Aug. 1996.

A. Gabor et al., *Block and Random Copolymer Resists Designed for 193 nm Lithography and Environmentally Friendly Supercritical $CO_2$Development*, SPIE, vol. 2724, pp. 410-417, Jun. 1996.

G. L. Schimek et al., *Supercritical Ammonia Synthesis and Characterization of Four New Alkali Metal Silver Antimony Sulfides. . .*, J. Solid State Chemistry, vol. 123, pp. 277-284, May 1996.

P. Gallagher-Wetmore et al., *Supercritical Fluid Proceesing: Opportunities for New Resist Materials and Processes*, SPIE, vol. 2725, pp. 289-299, Apr. 1996.

K. I. Papathomas et al., *Debonding of Photoresists by Organic Solvents*, J. Applied Polymer Science, vol. 59, pp. 2029-2037, Mar. 28, 1996.

J. J. Watkins et al., *Polymer/Metal Nanocomposite Synthesis in Supercritical $Co_2$*, Chemistry of Materials, vol. 7, No. 11, pp. 1991-1994, Nov. 1995.

E. F. Gloyna et al., *Supercritical Water Oxidation Research and Development Update*, Environmental Progress, vol. 14, No. 3, pp. 182-192, Aug. 1995.

P. Gallagher-Wetmore et al., *Supercritical Fluid Processing: A New Dry Technique for Photoresist Developing*, SPIE, vol. 2438, pp. 694-708, Jun. 1995.

A. H. Gabor et al., *Silicon-Containing Block Copolymer Resist Materials*, Microelectronics Technology—Polymers for Advanced Imaging and Packaging, ACS Symposium Series, vol. 615, pp. 281-298, Apr. 1995.

P. C. Tsiartas et al., *Effect of Molecular Weight Distribution on the Dissolution Properties of Novolac Blends*, SPIE, vol. 2438, pp. 264-271, Jun. 1995.

R. D. Allen et al., *Performance Properties of Near-Monodisperse Novolak Resins*, SPIE, vol. 2438, pp. 250-260, Jun. 1995.

P. T. Wood et al., *Synthesis of New Channeled Structures in Supercritical Amines . . .*, Inorg. Chem., vol. 33, pp. 1556-1558, 1994.

J. B. Jerome et al., *Synthesis of New Low-Dimensional Quaternary Compounds . . .*, Inorg. Chem., vol. 33, pp. 1733-1734, 1994.

J. McHardy et al., *Progress in Supercritical $Co_2$ Cleaning*, SAMPE Jour, vol. 29, No. 5, pp. 20-27, Sep. 1993.

R. Purtell et al., *Precision Parts Cleaning Using Supercritical Fluids*, J. Vac. Sci. Technol. A., vol. 11, No. 4, pp. 1696-1701, Jul. 1993.

E. Bok et al., *Supercritical Fluids for Single Wafer Cleaning*, Solid State Technology, pp. 117-120, Jun. 1992.

T. Adschiri et al., *Rapid and Continuous Hydrothermal Crystallization of Metal Oxide Particles in Supercritical Water*, J. Am. Ceram. Cos., vol. 75, No. 4, pp. 1019-1022, 1992.

B. N. Hansen et al., *Supercritical Fluid Transport—Chemical Deposition of Films*, Chem. Mater, vol. 4, No. 4, pp. 749-752, 1992.

S. H. Page et al., *Predictability and Effect of Phase Behavior of $CO_2$/Propylene Carbonate in Supercritical Fluid Chromatography*, J. Microcol, vol. 3, No. 4, pp. 355-369, 1991.

T. Brokamp et al., *Synthese und Kristallstruktur Eines Gemischtvalenten Lithium-Tantalnitride $Li_2Ta_3N_5$*, J. Alloys and Compounds, vol. 176, pp. 47-60, 1991.

B. M. Hybertson et al., *Deposition of Palladium Films by a Novel Supercritical Transport Chemical Deposition Process*, Mat. Res. Bull., vol. 26, pp. 1127-1133, 1991.

D. W. Matson et al., *Rapid Expansion of Supercritical Fluid Solutions: Solute Formation of Powders, Thin Films, and Fibers*, Ind. Eng. Chem. Res., vol. 26, No. 11, pp. 2298-2306, 1987.

W. K. Tolley et al., *Stripping Organics from Metal and Mineral Surfaces Using Supercritical Fluids*, Separation Science and Technology, vol. 22, pp. 1087-1101, 1987.

*Final Report on the Safety Assessment of Propylene Carbonate*, J. American College of Toxicology, vol. 6, No. 1, pp. 23-51, 1987.

*Porous Xerogel Films as Ultra-Low Permittivity Dielectrics for ULSI Interconnect Applications*, Materials Research Society, pp. 463-469, 1987.

Kawakami et al., *A Super Low-k(K=1,1) Silica Aerogel Film Using Supercritical Drying Technique*, IEEE, pp. 143-145, 2000.

R. F. Reidy, *Effects of Supercritical Processing on Ultra Low-k Films*, Texas Advanced Technology Program, Texas Instruments and the Texas Academy of Mathematics and Science.

Anthony Muscat, *Backend Processing Using Supercritical $Co_2$*, University of Arizona.

D. Goldfarb et al., *Aqueous-based Photoresist Drying Using Supercritical Carbon Dioxide to Prevent Pattern Collapse*, J. Vacuum Sci. Tech. B, vol. 18, No. 6, pp. 3313, 2000.

H. Namatsu et al., *Supercritical Drying for Water-Rinsed Resist Systems*, J. Vacuum Sci. Tech. B, vol. 18, No. 6, pp. 3308, 2000.

N. Sundararajan et al., *Supercritical $CO_2$ Processing for Submicron Imaging of Fluoropolymers*, Chem. Mater., vol. 12, 41, 2000.

Hideaki Itakura et al., *Multi-Chamber Dry Etching System*, Solid State Technology, pp. 209-214, Apr. 1982.

Joseph L. Foszez, *Diaphragm Pumps Eliminate Seal Problems*, Plant Engineering, pp. 1-5, Feb. 1, 1996.

Bob Agnew, *Wilden Air-Operated Diaphragm Pumps*, Process & Industrial Training Technologies, Inc., 1996.

* cited by examiner

METHOD AND APPARATUS FOR CLAMPING A SUBSTRATE IN A HIGH PRESSURE PROCESSING SYSTEM

FIELD OF THE INVENTION

The present invention relates to a method and system for clamping a substrate in a high pressure processing system and, more particularly, in a supercritical processing system.

BACKGROUND OF THE INVENTION

During the fabrication of semiconductor devices for integrated circuits (ICs), a sequence of material processing steps, including both pattern etching and deposition processes, are performed, whereby material is removed from or added to a substrate surface, respectively. During, for instance, pattern etching, a pattern formed in a mask layer of radiation-sensitive material, such as photoresist, using for example photolithography, is transferred to an underlying thin material film using a combination of physical and chemical processes to facilitate the selective removal of the underlying material film relative to the mask layer.

Thereafter, the remaining radiation-sensitive material, or photoresist, and post-etch residue, such as hardened photoresist and other etch residues, are removed using one or more cleaning processes. Conventionally, these residues are removed by performing plasma ashing in an oxygen plasma, followed by wet cleaning through immersion of the substrate in a liquid bath of stripper chemicals.

Until recently, dry plasma ashing and wet cleaning were found to be sufficient for removing residue and contaminants accumulated during semiconductor processing. However, recent advancements for ICs include a reduction in the critical dimension for etched features below a feature dimension acceptable for wet cleaning, such as a feature dimension below approximately 45 to 65 nanometers (nm). Moreover, the advent of new materials, such as low dielectric constant (low-k) materials, limits the use of plasma ashing due to their susceptibility to damage during plasma exposure.

At present, interest has developed for the replacement of dry plasma ashing and wet cleaning. One interest includes the development of dry cleaning systems utilizing a supercritical fluid as a carrier for a solvent, or other residue removing composition. The use of supercritical carbon dioxide, for example, in processing semiconductor wafers has been shown in the art.

Certain challenges occur when attempting to process silicon wafers under high pressure. One such issue is how to hold the wafer in place during processing. It has been shown that a wafer can be supported at discrete locations around its edge, with high pressure supercritical carbon dioxide (SCCO2) surrounding the entire wafer.

A different approach is to hold the wafer down on a platen using vacuum or reduced pressure from the top surface of the wafer, which has also been shown. In such a case, bias in pressure keeps the wafer in place during processing, which may include violent events such as sudden decompressions, high surface velocity jets for cleaning, etc. One of the significant drawbacks of vacuum holding is the restraining of the wafer against the platen. With such a large surface area of 300 millimeter (mm) wafers, for example, the exposed area of the platen, is subjected to loads that can exceed half a million pounds. Even very thick steels platens will deflect under this kind of load. Typical pressures encountered in SCCO2 processing are a minimum of 1,031 psi, but 3,000 psi is not uncommon, and upwards of 10,000 psi has been reported in the literature.

If a wafer is held against a platen, typically of stainless steel, the resulting static pressure load can force the wafer against the platen, which can cause damage to the backside of the wafer. Particulates that may be present can then get embedded into the platen or into the backside of the wafer. This can cause irreparable harm to the wafer for subsequent process steps.

Another effect of these high forces is the flexing of the platen under the pressure load. As the pressure increases, the wafer becomes restrained against the platen. As pressure continues to increase, the platen can bow due to the load. The wafer may or may not be able to follow the new shape that the platen is forced into due to the pressure load. Once the pressure is released or reduced, the wafer must again readjust for the change in shape of the platen. If multiple pressure cycles are applied, this effect can be repeated many times on a single wafer.

Results of this flexing can break wafers, because they are brittle and fragile and cannot elastically deform like stainless steel. It can also cause a grinding or fretting effect between the wafer and the platen, due to the high forces and small displacements which take place. This can create metal or silicon particles to be interspersed between the wafer and platen, which in turn can damage the current wafer, and be present on the platen to damage subsequent wafers that are processed.

The magnitude of this flexing may be considered trivial under ordinary industrial circumstances. Unfortunately with semiconductor wafers, flexing of less than 0.0010 inches, or even as little as 0.0005 inches, have been shown to cause significant damage to wafers, or wafer breakage.

At present, the inventors have recognized that if the force holding the wafer to the platen is reduced, the wafer can slip in relation to the platen, and the likelihood of breakage can be reduced. If the holding force is reduced even further in magnitude, then wear can also be eliminated because there would not be enough frictional force to create wear or particles.

Misalignment of features on the wafer platen, or poor flatness of the platen surface can also result in wafer breakage if the holding load is high. If the wafer is required to span over holes or slots in the platen, then the wafer becomes a "bridge" with the entire pressure load bearing down on an unsupported region of thin silicon. It doesn't take a very large span to break a wafer when subjected to 3,000 psi or higher pressures.

Accordingly, there is a need to overcome the above described problems.

SUMMARY OF THE INVENTION

An objective of the present invention is to provide a pressure biased wafer holder for a high pressure processing system, and a system and method for pressure biased wafer holding in high pressure processing systems. A further objective of the invention is to provide a high pressure processing system and wafer holder therefor that overcomes the problems of the prior art. A more particular objective of the present invention is to provide a vacuum chuck for a high pressure processing system, for example a supercritical fluid processing system, that will avoid platen deformation and other problems of high pressure processing of substrates, for example, of semiconductor wafers.

According to principles of the present invention, a method is provided for holding a semiconductor wafer to a platen in a high pressure fluid processing chamber. The method includes providing a rigid pressure plate between a high pressure fluid and an ambient atmosphere in the bottom of a processing chamber, supporting a platen disk on the pressure plate in the processing chamber, supporting a wafer on an upwardly facing surface of the platen disk, applying a vacuum to the backside of the supported wafer through passages within the platen disk, and substantially surrounding the underside of the platen disk with fluid at the pressure of high pressure fluid in the chamber.

According to certain embodiments of the present invention, a wafer holder is provided for holding a semiconductor wafer by fluid pressure bias when processing the wafer in a processing chamber with a high pressure fluid. The wafer holder includes a platen disk having a wafer supporting surface on its frontside and passages therein that communicate with the wafer supporting surface and located to apply relatively low pressure to the backside of a wafer supported on the wafer supporting surface to hold the wafer to the platen from the pressure of the high pressure fluid. A rigid pressure plate holds the disk in a cavity that is configured to receive the platen disk while forming a gap between the disk and the pressure plate to communicate high pressure fluid behind the disk to substantially isolate the platen disk from a substantial pressure gradient between its front and back sides.

Further according to some embodiments of the present invention, a processing system is provided for treating a substrate and includes a processing chamber configured to treat said substrate therein with a high pressure fluid, a platen coupled to said processing chamber and configured to support said substrate, a fluid supply system, a chuck coupled to said platen and configured to hold said substrate against said platen by a pressure gradient between said high pressure fluid and said platen; and means for substantially surrounding said platen with the high pressure fluid.

These and other objectives and advantages of the present invention are set forth in the detailed description of the exemplary embodiments below.

DETAILED DESCRIPTION OF EXEMPLARY EMBODIMENTS

In the following description, to facilitate a thorough understanding of the invention and for purposes of explanation and not limitation, specific details are set forth, such as a particular geometry of the processing system and various descriptions of the system components. However, it should be understood that the invention may be practiced with other embodiments that depart from these specific details.

Figure 1:
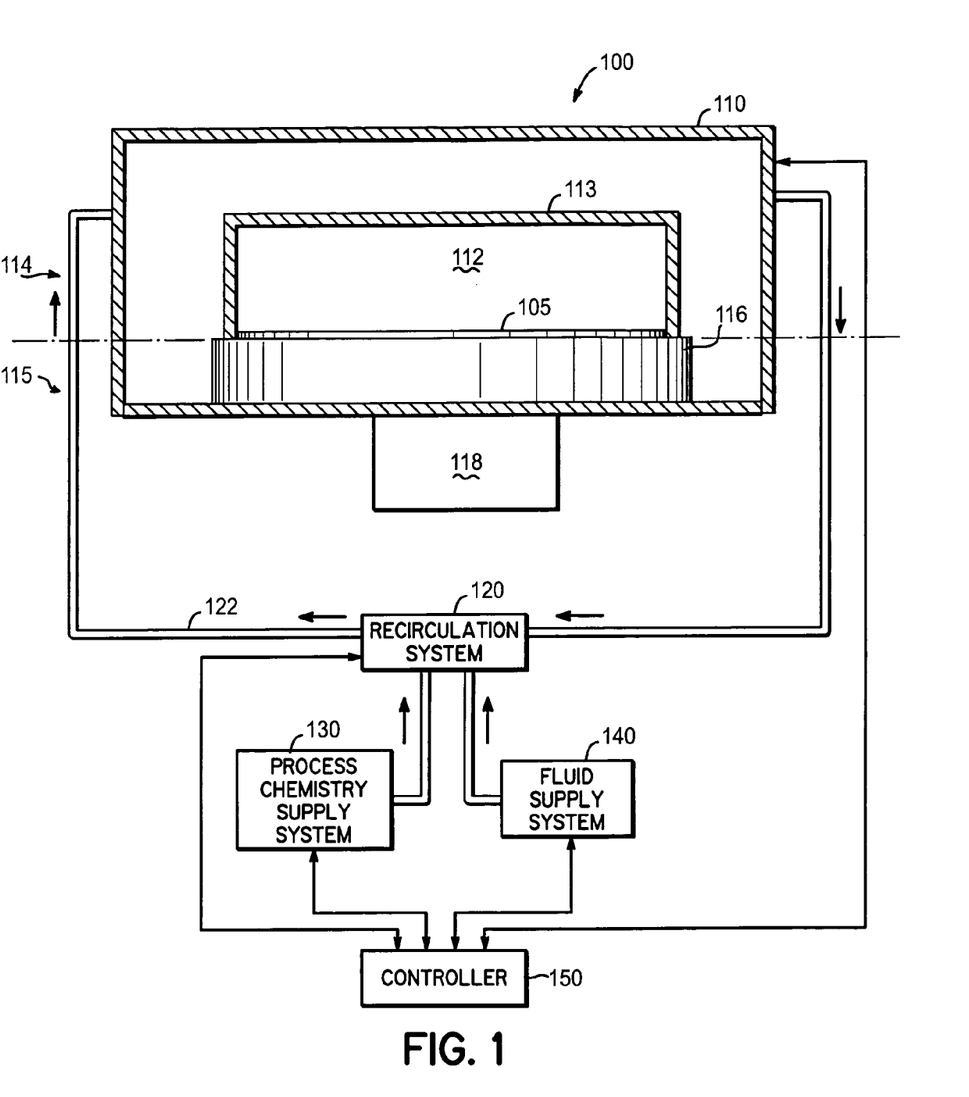
FIG. 1 is a simplified schematic representation of one embodiment of a processing system according to principles of the present invention.

Referring now to the drawings, wherein like reference numerals designate identical or corresponding parts throughout the several views, FIG. 1 illustrates a processing system 100 according to an embodiment of the invention. In the illustrated embodiment, processing system 100 is configured to treat a substrate 105 with a high pressure fluid, such as a fluid in a supercritical state, with or without other additives, such as process chemistry. The processing system 100 comprises processing elements that include a processing chamber 110, a fluid flow system 120, a process chemistry supply system 130, a high pressure fluid supply system 140, and a controller 150, all of which are configured to process substrate 105. The controller 150 can be coupled to the processing chamber 110, the fluid flow system 120, the process chemistry supply system 130, and the high pressure fluid supply system 140.

Alternately, or in addition, controller 150 can be coupled to a one or more additional controllers/computers (not shown), and controller 150 can obtain setup and/or configuration information from an additional controller/computer.

In FIG. 1, singular processing elements (110, 120, 130, 140, and 150) are shown, but this is not required for the invention. The processing system 100 can comprise any number of processing elements having any number of controllers associated with them in addition to independent processing elements.

The controller 150 can be used to configure any number of processing elements (110, 120, 130, and 140), and the controller 150 can collect, provide, process, store, and display data from processing elements. The controller 150 can comprise a number of applications for controlling one or more of the processing elements. For example, controller 150 can include a graphic user interface (GUI) component (not shown) that can provide easy to use interfaces that enable a user to monitor and/or control one or more processing elements. 100341 Referring still to FIG. 1, the fluid flow system 120 is configured to flow fluid and chemistry from the supplies 130 and 140 through the processing chamber 110. The fluid flow system 120 is illustrated as a recirculation system through which the fluid and chemistry recirculate from, and back to, the processing chamber 110 via primary flow line 122. This recirculation is most likely to be the preferred configuration for many applications, but this is not necessary to the invention. Fluids, particularly inexpensive fluids, can be passed through the processing chamber 110 once and then discarded, which might be more efficient than reconditioning them for re-entry into the processing chamber. Accordingly, while the fluid flow system or recirculation system 120 is described as a recirculating system in the exemplary embodiments, a non-recirculating system may, in some cases, be substituted. This fluid flow system 120 can include one or more valves (not shown) for regulating the flow of a processing solution through the fluid flow system 120 and through the processing chamber 110. The fluid flow system 120 can comprise any number of back-flow valves, filters, pumps, and/or heaters (not shown) for maintaining a specified temperature, pressure or both for the processing solution and for flowing the process solution through the fluid flow system 120 and through the processing chamber 110. Furthermore, any one of the many components provided within the fluid flow system 120 may be heated to a temperature consistent with the specified process temperature.

Some components, such as a fluid flow or recirculation pump, may require cooling in order to permit proper functioning. For example, some commercially available pumps, having specifications required for processing performance at high pressure and cleanliness during supercritical processing, comprise components that are limited in temperature. Therefore, as the temperature of the fluid and structure are elevated, cooling of the pump is required to maintain its functionality. Fluid flow system 120 for circulating or otherwise flowing the supercritical fluid through processing chamber 110 can comprise the primary flow line 122 coupled to high pressure processing system 100, and configured to supply the supercritical fluid at a fluid temperature equal to or greater than 40 degrees C. to the high pressure processing system 100, and a high temperature pump (not shown) coupled to the primary flow line 122. The high temperature pump can be configured to move the supercritical fluid through the primary flow line 122 to the processing chamber 110, wherein the high temperature pump comprises a coolant inlet configured to receive a coolant and a coolant outlet configured to discharge the coolant. A heat exchanger (not shown) coupled to the coolant inlet can be configured to lower a coolant temperature of the coolant to a temperature less than or equal to the fluid temperature of the supercritical fluid. Details regarding pump design are provided in co-pending U.S. patent application Ser. No. 10/987,066, entitled "Method and System for Cooling a Pump"; the entire content of which is herein incorporated by reference in its entirety.

Referring again to FIG. 1, the processing system 100 can comprise high pressure fluid supply system 140. The high pressure fluid supply system 140 can be coupled to the fluid flow system 120, but this is not required. In alternate embodiments, high pressure fluid supply system 140 can be configured differently and coupled differently. For example, the fluid supply system 140 can be coupled directly to the processing chamber 110. The high pressure fluid supply system 140 can include a supercritical fluid supply system. A supercritical fluid as referred to herein is a fluid that is in a supercritical state, which is that state that exists when the fluid is maintained at or above the critical pressure and at or above the critical temperature on its phase diagram. In such a supercritical state, the fluid possesses certain properties, one of which is the substantial absence of surface tension. Accordingly, a supercritical fluid supply system, as referred to herein, is one that delivers to a processing chamber a fluid that assumes a supercritical state at the pressure and temperature at which the processing chamber is being controlled. Furthermore, it is only necessary that at least at or near the critical point the fluid is in substantially a supercritical state at which its properties are sufficient, and exist long enough, to realize their advantages in the process being performed. Carbon dioxide, for example, is a supercritical fluid when maintained at or above a pressure of about 1,070 psi at a temperature of 31 degrees C. This state of the fluid in the processing chamber may be maintained by operating the processing chamber at 2,000 to 10,000 psi at a temperature of approximately 40 degrees C. or greater.

As described above, the fluid supply system 140 can include a supercritical fluid supply system, which can be a carbon dioxide supply system. For example, the fluid supply system 140 can be configured to introduce a high pressure fluid having a pressure substantially near the critical pressure for the fluid. Additionally, the fluid supply system 140 can be configured to introduce a supercritical fluid, such as carbon dioxide in a supercritical state. Additionally, for example, the fluid supply system 140 can be configured to introduce a supercritical fluid, such as supercritical carbon dioxide, at a pressure ranging from approximately the critical pressure of carbon dioxide to 10,000 psi. Examples of other supercritical fluid species useful in the broad practice of the invention include, but are not limited to, carbon dioxide (as described above), oxygen, argon, krypton, xenon, ammonia, methane, methanol, dimethyl ketone, hydrogen, water, and sulfuir hexafluoride. The fluid supply system can, for example, comprise a carbon dioxide source (not shown) and a plurality of flow control elements (not shown) for generating a supercritical fluid. For example, the carbon dioxide source can include a CO2 feed system, and the flow control elements can include supply lines, valves, filters, pumps, and heaters. The fluid supply system 140 can comprise an inlet valve (not shown) that is configured to open and close to allow or prevent the stream of supercritical carbon dioxide from flowing into the processing chamber 110. For example, controller 150 can be used to determine fluid parameters such as pressure, temperature, process time, and flow rate.

Referring still to FIG. 1, the process chemistry supply system 130 is coupled to the recirculation system 120, but this is not required for the invention. In alternate embodiments, the process chemistry supply system 130 can be configured differently, and can be coupled to different elements in the processing system I00. The process chemistry is introduced by the process chemistry supply system 130 into the fluid introduced by the fluid supply system 140 at ratios that vary with the substrate properties, the chemistry being used and the process being performed in the processing chamber 110. Usually the ratio is roughly 1 to 15 percent by volume in systems where the chamber, recirculation system and associated plumbing have a volume of about one liter. This amounts to about 10 to 150 milliliters of additive in most cases. The ratio may be higher or lower.

The process chemistry supply system 130 can be configured to introduce one or more of the following process compositions, but not limited to: cleaning compositions for removing contaminants, residues, hardened residues, photoresist, hardened photoresist, post-etch residue, post-ash residue, post chemical-mechanical polishing (CMP) residue, post-polishing residue, or post-implant residue, or any combination thereof; cleaning compositions for removing particulate; drying compositions for drying thin films, porous thin films, porous low dielectric constant materials, or air-gap dielectrics, or any combination thereof; film-forming compositions for preparing dielectric thin films, metal thin films, or any combination thereof; healing compositions for restoring the dielectric constant of low dielectric constant (low-k) films; sealing compositions for sealing porous films; or any combination thereof. Additionally, the process chemistry supply system 130 can be configured to introduce solvents, co-solvents, surfactants, etchants, acids, bases, chelators, oxidizers, film-forming precursors, or reducing agents, or any combination thereof.

The process chemistry supply system 130 can be configured to introduce N-methyl pyrrolidone (NMP), diglycol amine, hydroxyl amine, di-isopropyl amine, tri-isoprpyl amine, tertiary amines, catechol, ammonium fluoride, ammonium bifluoride, methylacetoacetamide, ozone, propylene glycol monoethyl ether acetate, acetylacetone, dibasic esters, ethyl lactate, CHF3, BF3, HF, other fluorine containing chemicals, or any mixture thereof. Other chemicals such as organic solvents may be utilized independently or in conjunction with the above chemicals to remove organic materials. The organic solvents may include, for example, an alcohol, ether, and/or glycol, such as acetone, diacetone alcohol, dimethyl sulfoxide (DMSO), ethylene glycol, methanol, ethanol, propanol, or isopropanol (IPA). For further details, see U.S. Pat. No. 6,306,564, filed May 27, 1998, and titled "Removal of Resist or Residue from Semiconductors Using Supercritical Carbon Dioxide", and U.S. Pat. No. 6,509,141, filed Sep.

3, 1999, and titled "Removal of Photoresist and Photoresist Residue from Semiconductors Using Supercritical Carbon dioxide Process," both incorporated by reference herein.

Additionally, the process chemistry supply system 130 can comprise a cleaning chemistry assembly (not shown) for providing cleaning chemistry for generating supercritical cleaning solutions within the processing chamber. The cleaning chemistry can include peroxides and a fluoride source. For example, the peroxides can include hydrogen peroxide, benzoyl peroxide, or any other suitable peroxide, and the fluoride sources can include fluoride salts (such as ammonium fluoride salts), hydrogen fluoride, fluoride adducts (such as organo-ammonium fluoride adducts), and combinations thereof. Further details of fluoride sources and methods of generating supercritical processing solutions with fluoride sources are described in U.S. patent application Ser. No. 10/442,557, filed May 20, 2003, and titled "Tetra-Organic Ammonium Fluoride and HF in Supercritical Fluid for Photoresist and Residue Removal", and U.S. patent application Ser. No. 10/321,341, filed Dec. 16, 2002, and titled "Fluoride in Supercritical Fluid for Photoresist Polymer and Residue Removal," both incorporated by reference herein.

Furthermore, the process chemistry supply system 130 can be configured to introduce chelating agents, complexing agents and other oxidants, organic and inorganic acids that can be introduced into the supercritical fluid solution with one or more carrier solvents, such as N,N-dimethylacetamide (DMAc), gamma-butyrolactone (BLO), dimethyl sulfoxide (DMSO), ethylene carbonate (EC), N-methyl pyrrolidone (NMP), dimethylpiperidone, propylene carbonate, and alcohols (such a methanol, ethanol and 2-propanol).

Moreover, the process chemistry supply system 130 can comprise a rinsing chemistry assembly (not shown) for providing rinsing chemistry for generating supercritical rinsing solutions within the processing chamber. The rinsing chemistry can include one or more organic solvents including, but not limited to, alcohols and ketone. In one embodiment, the rinsing chemistry can comprise sulfolane, also known as thiocyclopentane-1,1-dioxide, (cyclo)tetramethylene sulphone and 2,3,4,5-tetrahydrothiophene-1,1-dioxide, which can be purchased from a number of venders, such as Degussa Stanlow Limited, Lake Court, Hursley Winchester SO21 2LD UK.

Furthermore, the process chemistry supply system 130 can be configured to introduce treating chemistry for curing, cleaning, healing (or restoring the dielectric constant of low-k materials), or sealing, or any combination thereof, or for applying low dielectric constant films (porous or non-porous). The chemistry can include hexamethyldisilazane (HMDS), chlorotrimethylsilane (TMCS), trichloromethylsilane (TCMS), dimethylsilyldiethylamine (DMSDEA), tetramethyldisilazane (TMDS), trimethylsilyldimethylamine (TMSDMA), dimethylsilyldimethylamine (DMSDMA), trimethylsilyldiethylamine (TMSDEA), bistrimethylsilyl urea (BTSU), bis(dimethylamino)methyl silane (B[DMA]MS), bis (dimethylamino)dimethyl silane (B[DMA]DS), HMCTS, dimethylaminopentamethyldisilane (DMAPMDS), dimethylaminodimethyldisilane (DMADMDS), disila-aza-cyclopentane (TDACP), disila-oza-cyclopentane (TDOCP), methyltrimethoxysilane (MTMOS), vinyltrimethoxysilane (VTMOS), or trimethylsilylimidazole (TMSI). Additionally, the chemistry may include N-tert-butyl- 1,1-dimethyl- 1-(2, 3,4,5-tetramethyl-2,4-cyclopentadiene- 1-yl)silanamine, 1,3-diphenyl- 1,1,3,3-tetramethyldisilazane, or tert-butylchlorodiphenylsilane. For further details, see U.S. patent application Ser. No. 10/682,196, filed Oct. 10, 2003, and titled "Method and System for Treating a Dielectric Film," and U.S. patent application Ser. No. 10/379,984, filed Mar. 4, 2003, and titled "Method of Passivating Low Dielectric Materials in Wafer Processing," both incorporated by reference herein.

Additionally, the process chemistry supply system 130 can be configured to introduce peroxides during, for instance, cleaning processes. The peroxides can include organic peroxides, or inorganic peroxides, or a combination thereof. For example, organic peroxides can include 2-butanone peroxide; 2,4-pentanedione peroxide; peracetic acid; t-butyl hydroperoxide; benzoyl peroxide; or m-chloroperbenzoic acid (mCPBA). Other peroxides can include hydrogen peroxide.

The processing chamber 110 can be configured to process substrate 105 by exposing the substrate 105 to fluid from the fluid supply system 140, or process chemistry from the process chemistry supply system 130, or a combination thereof in a processing space 112. Additionally, processing chamber 110 can include an upper chamber assembly 114, and a lower chamber assembly 115.

The upper chamber assembly 114 can comprise a heater (not shown) for heating the processing chamber 110, the substrate 105, or the processing fluid, or a combination of two or more thereof. Alternately, a heater is not required. Additionally, the upper chamber assembly 114 can include flow components for flowing a processing fluid through the processing chamber 110. In one embodiment, the high pressure fluid is introduced to the processing chamber 110 through a ceiling formed in the upper chamber assembly 112 and located above substrate 105 through one or more inlets located above a substantially center portion of substrate 105. The high pressure fluid flows radially outward across an upper surface of substrate 105 beyond a peripheral edge of substrate 105, and discharges through one or more outlets, wherein the spacing between the upper surface of substrate 105 and the ceiling decreases with radial position from proximate the substantially center portion of substrate 105 to the peripheral edge of substrate 105.

The lower chamber assembly 115 can include a platen 116 configured to support substrate 105 and a drive mechanism 118 for translating the platen 116 in order to load and unload substrate 105, and sealing lower chamber assembly 115 with upper chamber assembly 114. The platen 116 can also be configured to heat or cool the substrate 105 before, during, and/or after processing the substrate 105. For example, the platen 116 can include one or more heater rods configured to elevate the temperature of the platen to approximately 31 degrees C. or greater. Additionally, the lower assembly 115 can include a lift pin assembly for displacing the substrate 105 from the upper surface of the platen 116 during substrate loading and unloading.

Additionally, controller 150 includes a temperature control system coupled to one or more of the processing chamber 110, the fluid flow system 120 (or recirculation system), the platen 116, the high pressure fluid supply system 140, or the process chemistry supply system 130. The temperature control system is coupled to heating elements embedded in one or more of these systems, and configured to elevate the temperature of the supercritical fluid to approximately 31 degrees C. or greater. The heating elements can, for example, include resistive heating elements.

A transfer system (not shown) can be used to move a substrate into and out of the processing chamber 110 through a slot (not shown). In one example, the slot can be opened and closed by moving the platen 116, and in another example, the slot can be controlled using an on-off valve (not shown).

The substrate can include semiconductor material, metallic material, dielectric material, ceramic material, or polymer material, or a combination of two or more thereof. The semiconductor material can include Si, Ge, Si/Ge, or GaAs. The metallic material can include Cu, Al, Ni, Pb, Ti, and/or Ta. The dielectric material can include silica, silicon dioxide, quartz, aluminum oxide, sapphire, low dielectric constant materials, TEFLON®, and/or polyimide. The ceramic material can include aluminum oxide, silicon carbide, etc.

The processing system 100 can further comprise an exhaust control system. The exhaust control system can be coupled to the processing chamber 110, but this is not required. In alternate embodiments, the exhaust control system can be configured differently and coupled differently. The exhaust control system can include an exhaust gas collection vessel (not shown) and can be used to remove contaminants from the processing fluid. Such exhaust control system can be used as an alternative to the recirculation system 120 that is provided to recycle the processing fluid.

The processing system 100 can also comprise a pressure control system (not shown). The pressure control system can be coupled to the processing chamber 110, but this is not required. In alternate embodiments, the pressure control system can be configured differently and coupled differently. The pressure control system can include one or more pressure valves (not shown) for exhausting the processing chamber 110 and/or for regulating the pressure within the processing chamber 110. Alternately, the pressure control system can also include one or more pumps (not shown). For example, one pump may be used to increase the pressure within the processing chamber, and another pump may be used to evacuate the processing chamber 110. In another embodiment, the pressure control system can comprise seals for sealing the processing chamber. In addition, the pressure control system can comprise an elevator for raising and lowering the substrate 105 and/or the platen 116.

The platen 116 is a platen assembly that includes a vacuum chuck for clamping the wafer to the platen. The platen 116 includes a semiconductor wafer platen disk that is isolated for use in high pressure processing, where the use of vacuum chucking for holding a semiconductor wafer during processing usually presents some difficulties, such as, for example, small deflections in the support platens that can lead to backside wafer wear, platen abrasion, and or breakage of semiconductor wafers. These difficulties are largely eliminated by platen assembly features to allow vacuum chucking to be used in high pressure processing.

Figure 2:
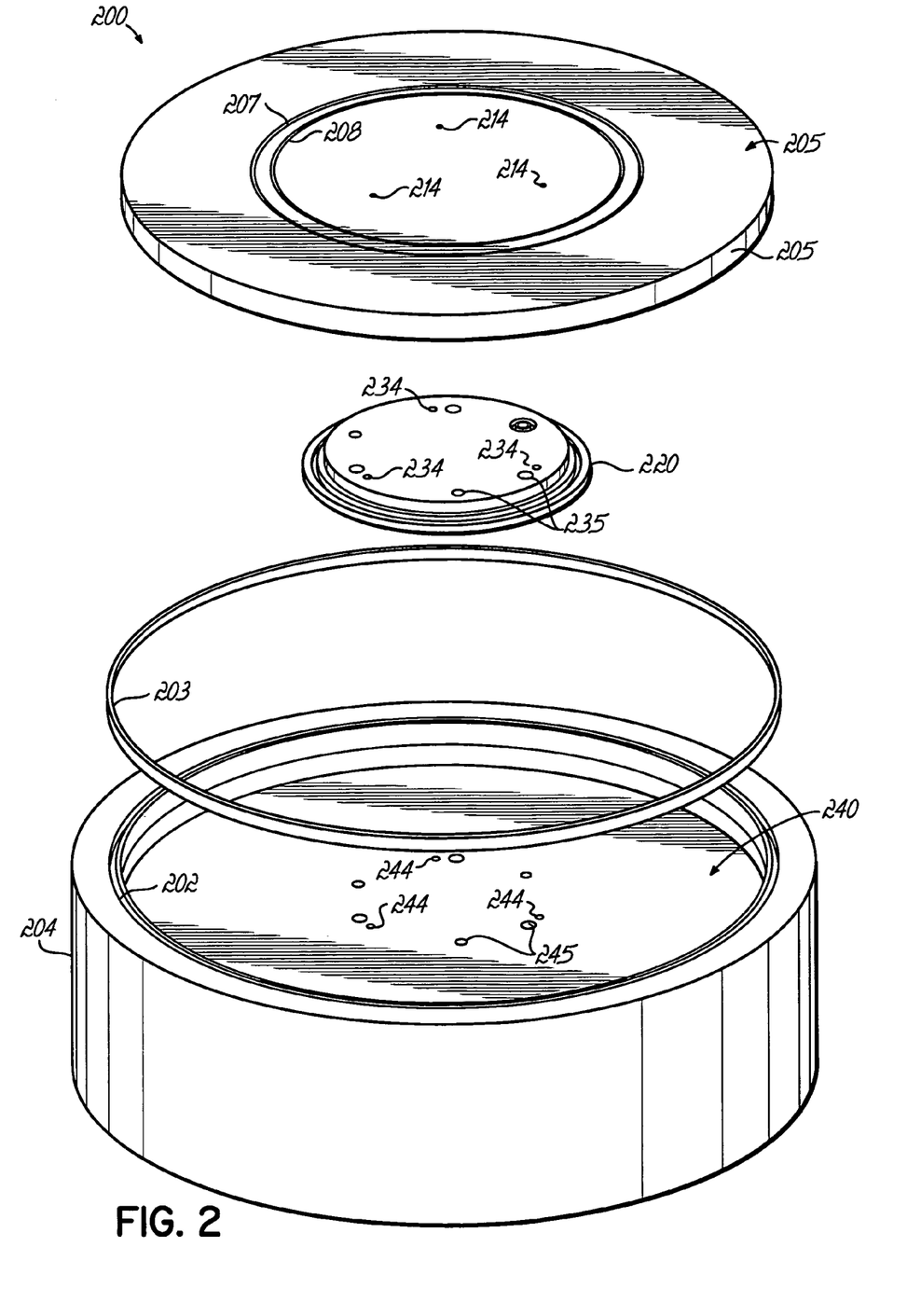
FIG. 2 is a disassembled top perspective view of a platen assembly according to one embodiment of the system of FIG. 1.

FIG. 2 is a top exploded perspective view of one embodiment 200 of a platen assembly 116 according to the principles of the present invention. The illustrated embodiment 200 of the wafer platen assembly 116 includes disk 201, which may usually be of stainless steel. The disk 201 has a highly polished top face 205 on which the wafer 105 will rest. The wafer platen disk 201 has two concentric vacuum grooves 207, 208 on its face 205. These grooves 207, 208 are connected through passages to one or more ports on the underside of the platen assembly 200, which ports connect to a vacuum pump or other low pressure source remote from the processing chamber. The vacuum source applies negative pressure, typically maintained at at least 10 psi below atmospheric pressure, to apply a negative pressure to the underside of the wafer 105 that will hold the wafer 105 to the surface 205 whether the chamber 110 is pressurized or depressurized.

Figure 4:
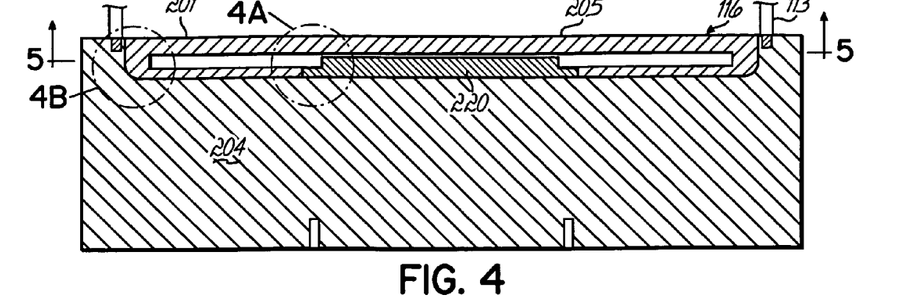
FIG. 4 is a cross-sectional elevational view taken along line 4-4 of FIG. 3.
Figure 5:
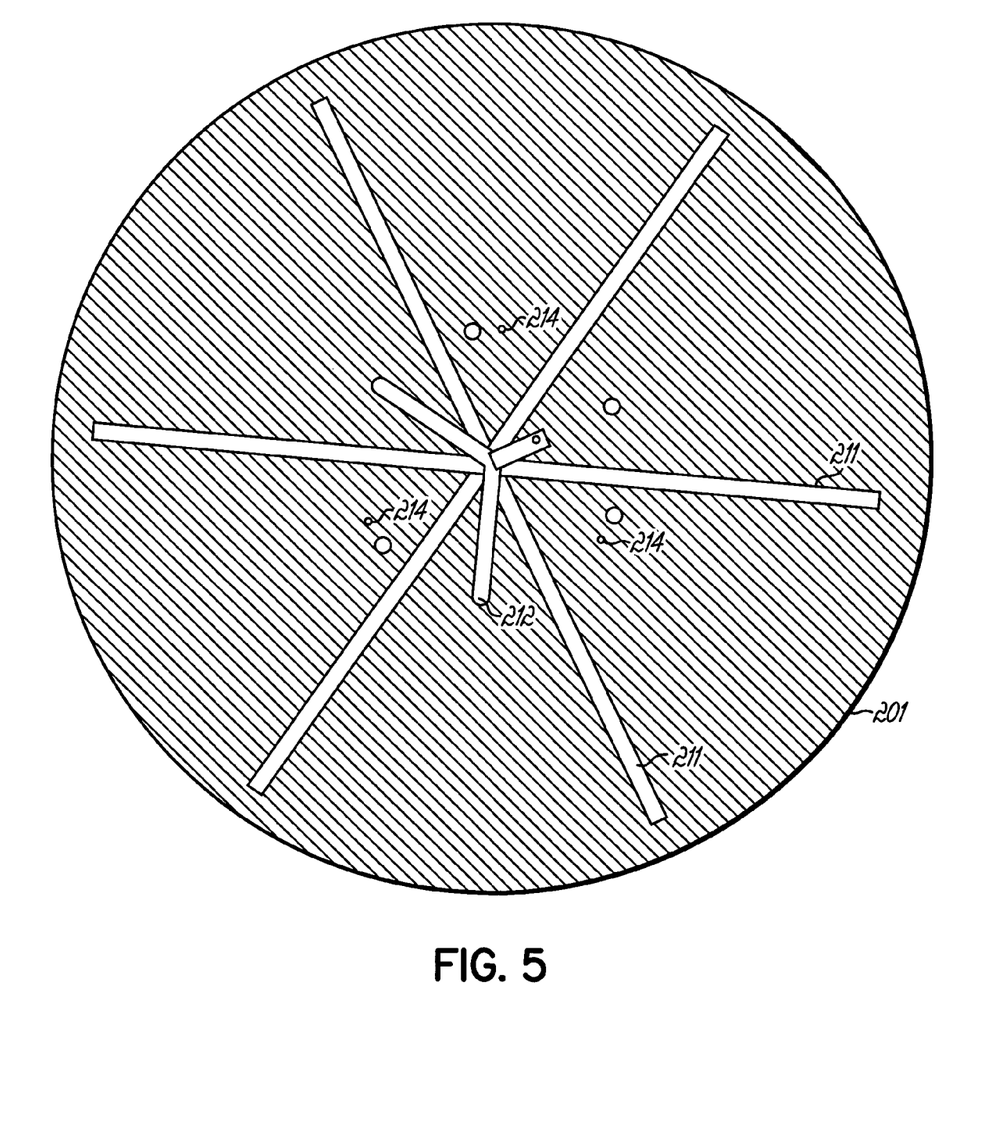
FIG. 5 is a cross-sectional view taken along line 5-5 of FIG. 4.
Figure 6:
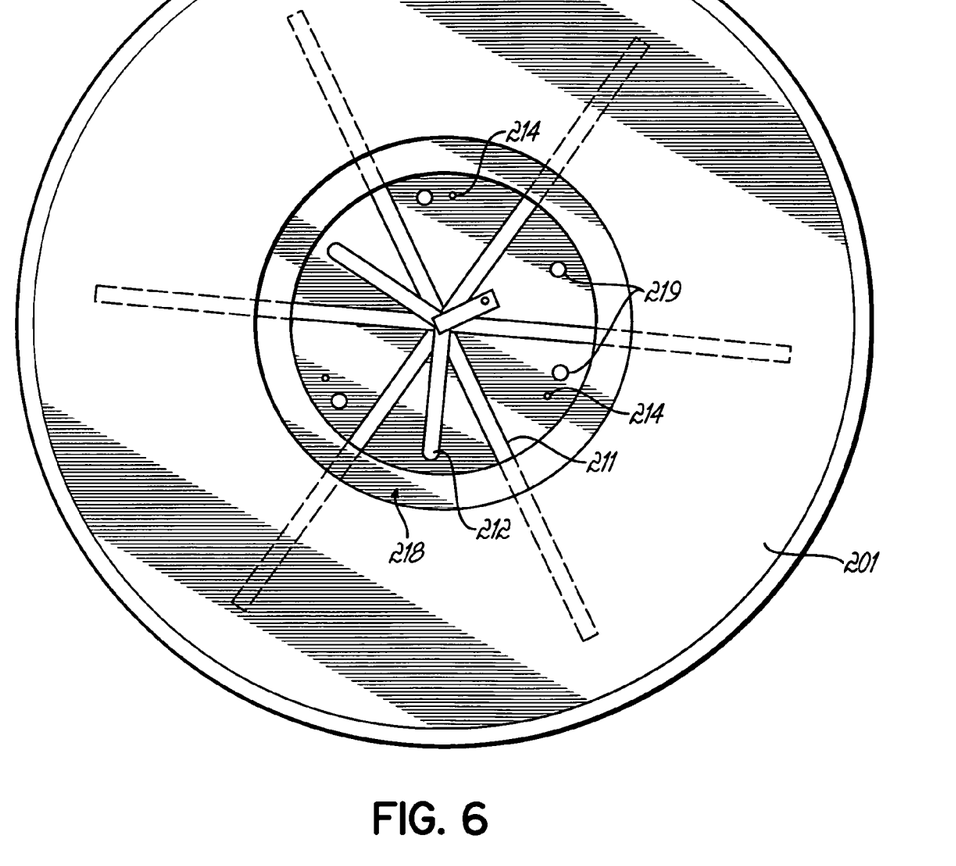
FIG. 6 is a bottom view of the platen of the assembly of FIGS. 1-3.

The disk 201 may contain a variety of radial bores, including bores 211 (FIGS. 2, 4 and 5) for the use of rod style heater cartridges (not shown), as well as bores 212 for mounting a control thermocouple (TC). The disk 201 also has three small axial through bores 214 extending through the top face 205 and through to the bottom of the assembly 200 for wafer lifting pins (not shown). On the backside of the disk 201 is a stepped circular recess 218 to accept isolation plate 220. See FIG. 3 and FIG. 5 for bottom view of the disk 201 and FIG. 4 for cross-section thru the disk 201 at the elevation of the heater rod bores 211.

Figure 4A:
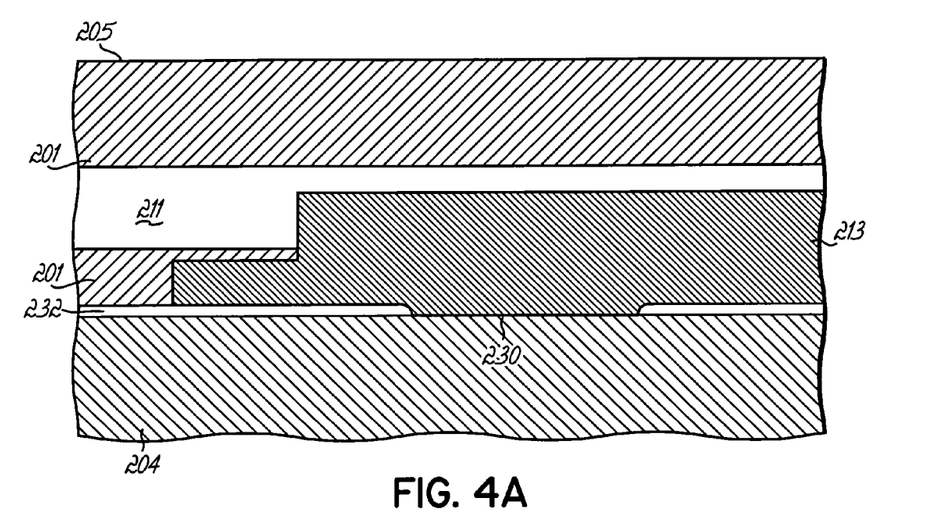
FIG. 4A is an enlarged view of the encircled portion 4A of FIG. 4.
Figure 4B:
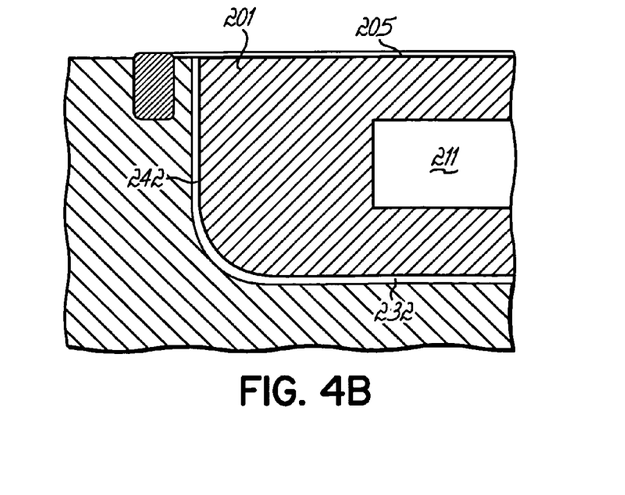
FIG. 4B is an enlarged view of the encircled portion 4B of FIG. 4.

Isolation plate 220 contains o-ring groove features (not shown) for holding o-rings for sealing between it and the disk 201 of the wafer platen assembly 200, between the wafer platen 201 vacuum bore and the isolation plate 220. Grooves for o-ring seals 224 are also provided on the underside of the isolation plate 220 between all the pass-thru bores and the pressure plate 204. The isolation plate 220 has very small pads 230 (see FIG. 4A) that extend beyond the bottom plane of the isolation plate 220. These pads 230 space off the isolation plate 220 and the wafer platen disk 201 from the pressure plate 204 to leave a narrow gap 232 between the pressure plate 204 and both the isolation disk 220 and platen disk 201. By spacing off from the pressure plate 204, the very small gap 232 is created underneath the entire wafer platen 201 and the isolation plate 220, which will fill with pressurized fluid from the processing chamber and equalize pressure with the fluid filling up to the top side 205 of the wafer platen 201, as shown in FIG. 4B. This will create a situation where any increase in chamber pressure will result in no pressure gradient across the wafer platen of the wafer platen disk 201 that would produce deflection or distortion of the wafer platen disk 201. This is because the disk 201 and the isolation plate 220 "float" in the pressurized gas that fills the gap 232. Although there will be forces applied where the o-rings on the bottom side of the isolation plate 220 mount against the pressure plate 204 due to the differences in pressures, these loads will be "spot" loads and will not contribute substantially to, and bending of, the wafer platen disk 201.

Further, the pads 230 on the bottom of the isolation plate 220 are arranged in a circular pattern. The result of analysis and wear has shown that a thick platen assembly 200 that includes the pressure plate 204 will flex in an expanding and contracting radial pattern. By arranging other structures in a similar circular pattern, the flexing can be better followed by the isolation plate 220 and all the mounting fasteners. Accordingly, it is preferential not to bolt in a non-symmetric pattern when such movement can occur, as uneven stress and wear patterns can develop.

Figure 3:
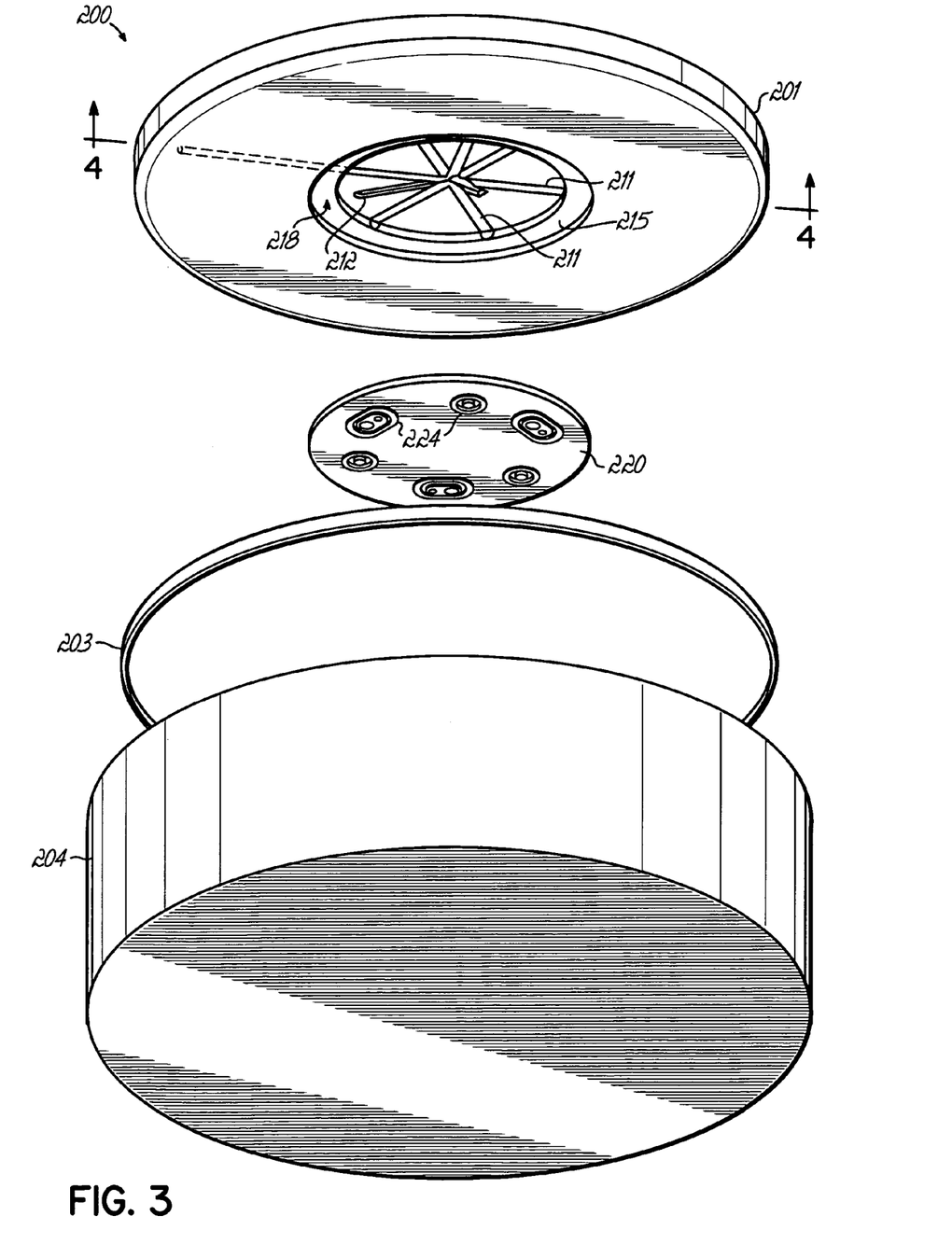
FIG. 3 is a disassembled bottom perspective view of the platen assembly of FIG. 2.

A seal ring 203, shown in FIGS. 2 and 3, fits into an annular groove 202 in the top face of the peripheral edge of the pressure plate 204. The seal 203 creates a pressure tight seal when the pressure plate 204 is brought into intimate contact with the rest of the chamber assembly, such as inner wall 113 of FIG. 1, to enclose a cavity containing the processing space 212 directly above the top surface 205 of the wafer platen disk 201 into which the supercritical $CO_2$ may be introduced for processing. Not shown for clarity are a number of other o-ring seals on the isolation plate 220.

Pressure plate 204 is a thick piece of stainless steel and can serve as a closure for one side of the pressure vessel for the processing chamber 110. The thicker the pressure plate 204, the less will be its deflection during high pressure processing. Typically, a range of thickness about 3 to 5 inches is usually sufficient for a 3,000 psi chamber design for a chamber for processing 200 millimeter and 300 millimeter diameter wafers. The top face of the pressure plate 204 contains a cylindrical recess 240 configured to accept the wafer platen disk 201 plus a very small additional space 242 at the periphery of the gap 232 all the way around the perimeter of the disk 201. The gap thickness is not a critical dimension, but with a smaller gap, less gas and additional co-solvents will be required to fill the gap volume. Gaps on the order of 0.020 inches are usually acceptable, but gaps an inch or more may also be acceptable. Further, if the space 242 is not narrow, additional structure to hold the disk 201 on center is desirable.

In the center portion of the pressure plate 204 are a series of mating holes 245 for retention bolts which will mount through holes 235 in the isolation plate 220 and into holes 219 in the wafer platen disk 201. Bores 244 are also provided to allow for a set of three lift pins to pass through the pressure plate 204, in alignment with the bores 214 in the disk 201 and bores 234 in the isolation plate 220, to lift a wafer 105 from, and lower a wafer 105 onto, the surface 205. The lift pin mechanism is not shown, but various mechanisms are well known in the art. Also provided in the pressure plate 204 are pass-through holes for wiring associated with heaters and thermocouples that are mounted in the bores 211 and 212, respectively.

Although one embodiment is depicted in the drawings, other versions and features are contemplated. For example, it is anticipated that an over temperature switch will be incorporated into the wafer platen disk 201. This will require more bores or cavities in wafer platen 201. The use of a patch type heating element may be employed instead of separate heating rods. A single center support or pad may also be used instead of multiple pads in a circular pattern as depicted. Each such variation or design may have its own merits based on specific circumstances.

Further advantages include the ability to locate a vent beneath the wafer platen disk 201, which may improve flow dynamics in some chamber designs. Typically, the disk 201 and isolation plate 220, and all of the cavities and ports within them, may be machined into a single piece wafer platen disk 201, or even a single piece assembly of platen disk 201 and pressure plate 204. The fabrication of such large parts can be a complex task. If the wafer platen disk 201, as illustrated in the assembly 200, is separated from the rest of the wafer platen assembly 200, the production and overall cost of the parts is reduced. Also, with separate parts, the refurbishment costs may be greatly reduced since only the wafer platen disk 201 is likely to need to be overhauled on most occasions.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A wafer holder for holding a semiconductor wafer by fluid pressure bias when processing the wafer in a processing chamber with a high pressure fluid, the wafer holder comprising:
   a platen disk having a backside, a frontside, and a wafer supporting surface on the frontside thereof, the disk having passages therein communicating with the wafer supporting surface, the passages being located such that, when fluid at a pressure lower than that of the high pressure fluid is applied therethrough to the backside of a wafer supported on the wafer supporting surface, the high pressure fluid in the chamber holds the wafer for processing against the wafer supporting surface; and
   a pressure plate below the platen disk and having a body sufficiently rigid to resist deformation when subjected to the high pressure fluid, said pressure plate having a cavity therein having the platen disk therein, the cavity being sufficiently larger than the platen disk and forming a gap between the disk and the pressure plate to allow the high pressure fluid therein;
   said gap communicating the high pressure of the high pressure fluid against the backside of said platen disk and thereby substantially isolating said platen disk from a substantial pressure gradient between the frontside and backside thereof.

2. The wafer holder of claim 1 wherein said platen disk has a recess on the backside thereof and said holder further comprises an isolation plate sealed in said recess to form hollow volume in said platen disk that communicates with the passages therein.

3. The wafer holder of claim 1 further comprising structure supporting said platen disk in said cavity spaced from said pressure plate for providing said gap.

4. The wafer holder of claim 3 wherein said platen is spaced approximately 0.020 inches from said pressure plate.

5. The wafer holder of claim 3 wherein:
   said platen disk has a recess on the backside thereof and said holder further comprises an isolation plate sealed in said recess to form hollow volume in said platen disk that communicates with the passages therein; and
   said structure includes pads formed on said isolation plate for holding said platen disk spaced from said pressure plate in said cavity.

6. The wafer holder of claim 3 wherein said platen disk is generally circular and said structure and said cavity are distributed symmetrically around the center of said platen disk.

7. The wafer holder of claim 1 wherein said pressure plate includes a seal that surrounds said cavity that is pressure tight when the pressure plate is brought into intimate contact with the chamber, whereby said pressure plate forms a wall of said chamber having a pressure gradient across it separating the high pressure fluid in said chamber from an ambient pressure environment outside of said chamber.

8. The wafer holder of claim 1 wherein said pressure plate has a thickness between 3 and 5 inches and a diameter of over 200 millimeters.

9. The wafer holder of claim 8 wherein said pressure plate a diameter of over 300 millimeters.

10. A high pressure processing apparatus comprising the wafer holder of claim 1 and further comprising:
    a processing chamber;
    a high pressure fluid system coupled to said processing chamber and operable to provide high pressure processing to said chamber for processing a substrate therein;
    said wafer holder being coupled to said chamber for holding a wafer thereto by pressure bias and supporting the wafer in the chamber for processing with said high pressure fluid.

11. A processing system for treating a substrate comprising:
    a processing chamber configured to treat said substrate therein with a high pressure fluid;
    a platen coupled to said processing chamber and configured to support said substrate;
    a fluid supply system;
    a chuck coupled to said platen and configured to hold said substrate against said platen by a pressure gradient between said high pressure fluid and said platen; and
    means for substantially surrounding said platen with the high pressure fluid.

12. The system of claim 11 further comprising:
    means for supporting the platen in the chamber.

13. The system of claim 11 further comprising:
    means for rigidly supporting the platen in the chamber.

14. A semiconductor wafer processing apparatus comprising:
- a chamber surrounded by a chamber wall having a bottom, the chamber being configured to treat said substrate therein with a high pressure fluid;
- a rigid pressure plate in the bottom of a processing chamber between a high pressure fluid within the chamber and an ambient atmosphere outside of the chamber;
- a platen disk on the pressure plate in the processing chamber configured for supporting a wafer on an upwardly facing surface of the platen disk with an upwardly facing frontside of the wafer in contact with high pressure fluid in the chamber, the platen disk having passages therein;
- means for applying a pressure lower than that of the high pressure fluid to the backside of the supported wafer through the passages within the platen disk; and
- means for substantially surrounding the underside of the platen disk with fluid at the pressure of high pressure fluid in the chamber.

15. The apparatus of claim 14 further comprising:

means for processing a wafer supported on the platen disk with a high pressure fluid in the processing chamber.

16. The apparatus of claim 14 further comprising:

means for processing a wafer supported on the platen disk with a supercritical fluid in the processing chamber.

17. The apparatus of claim 14 further comprising:

means for processing a wafer supported on the platen disk with a supercritical carbon dioxide in the processing chamber.

* * * * *

UNITED STATES PATENT AND TRADEMARK OFFICE
CERTIFICATE OF CORRECTION

PATENT NO. : 7,434,590 B2
APPLICATION NO. : 11/022248
DATED : October 14, 2008
INVENTOR(S) : Alexei Sheydayi It is certified that error appears in the above-identified patent and that said Letters Patent is hereby corrected as shown below:

In Column 1, line 54, "(SCCO2)" should read --(SCCO$_2$)--.

In Column 1, lines 65-67:
"platen, is subjected to loads that can exceed half a million pounds. Even very thick steels platens will deflect under this kind of load. Typical pressures encountered in SCCO2"
should read:
--platen is subjected to loads that can exceed half a million pounds. Even very thick steel platens will deflect under this kind of load. Typical pressures encountered in SCCO$_2$--.

In Column 4, lines 37-38, two sentences are joined with paragraph number [0034] instead of a paragraph return:
"user to monitor and/or control one or more processing elements. 100341
Referring still to FIG. 1, the fluid flow system"
should read:
--user to monitor and/or control one or more processing elements.
Referring still to FIG. 1, the fluid flow system--.

In Column 5, line 4, "as the temperature of the fluid and structure are" should read --as the temperatures of the fluid and structure are--.

In Column 6, line 8, "CO2 should read --CO$_2$--.

In Column 6, line 21, "processing system I 00." should read --processing system 100.--.

In Column 6, lines 53-54, "tri-isoprpylamine," should read --tri-isopropylamine,--.

In Column 6, line 57, "CHF3, BF3," should read --CHF$_3$, BF$_3$,--.

CERTIFICATE OF CORRECTION (continued)
U.S. Pat. No. 7,434,590 B2

In Column 10, line 51, "CO2" should read --$CO_2$--.

In Claim 9, Column 12, lines 38-39, "The wafer holder of claim 8 wherein said pressure plate a diameter of over 300 millimeters." should read --The wafer holder of claim 8 wherein said pressure plate has a diameter of over 300 millimeters.--.

Signed and Sealed this

Twenty-third Day of February, 2010

David J. Kappos
*Director of the United States Patent and Trademark Office*